United States Patent
Hall et al.

(10) Patent No.: US 8,774,746 B2
(45) Date of Patent: *Jul. 8, 2014

(54) FALSE SIGNAL DETECTION IN SIGNALS IN WIRELESS COMMUNICATIONS

(71) Applicant: Broadcom Corporation, Irvine, CA (US)

(72) Inventors: Steven D. Hall, Olivenhain, CA (US); Brima Ibrahim, Laguna Hills, CA (US); Langford Wasada, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/789,498

(22) Filed: Mar. 7, 2013

(65) Prior Publication Data

US 2013/0183919 A1 Jul. 18, 2013

Related U.S. Application Data

(63) Continuation of application No. 12/925,074, filed on Oct. 12, 2010, now Pat. No. 8,396,437, which is a continuation of application No. 11/786,682, filed on Apr. 11, 2007, now Pat. No. 7,835,713.

(51) Int. Cl.
   *H04B 1/06* (2006.01)
   *H04B 7/00* (2006.01)

(52) U.S. Cl.
   USPC ......... 455/232.1; 455/214; 455/254; 455/263

(58) Field of Classification Search
   USPC ............ 455/232.1, 214, 254, 26, 130, 194.2, 455/226.1, 228, 230, 24.1, 250.1, 3
   See application file for complete search history.

(56) References Cited

U.S. PATENT DOCUMENTS

| | | | | |
|---|---|---|---|---|
| 5,478,997 A | * | 12/1995 | Bridgelall et al. | 235/462.25 |
| 5,714,910 A | * | 2/1998 | Skoczen et al. | 331/3 |
| 7,409,226 B1 | * | 8/2008 | Stevenson | 455/562.1 |
| 7,522,672 B2 | * | 4/2009 | Saed | 375/260 |
| 7,847,492 B2 | * | 12/2010 | Okamoto et al. | 315/308 |

* cited by examiner

*Primary Examiner* — Pablo Tran
(74) *Attorney, Agent, or Firm* — Oblon, Spivak, McCleland, Maier & Neustadt, L.L.P.

(57) ABSTRACT

There is provided a method for use in a wireless communication to avoid detection of a false modulated signal in a paged device. In one embodiment, a modulated signal is received by the paged device. Then, the modulated signal is identified by the paged device as a preliminary false modulated signal. Thereafter, the gain of at least one paged device amplifier and/or a matching threshold of the paged device is reduced by the paged device to decrease a sensitivity of the paged device to avoid detection of a future false modulated signal. In one embodiment, the wireless communication is a Bluetooth wireless communication and the paged device is a Bluetooth enabled device. An exemplary system for implementing one embodiment of the disclosed method is described.

12 Claims, 3 Drawing Sheets

FALSE SIGNAL DETECTION IN SIGNALS IN WIRELESS COMMUNICATIONS

This is a continuation of application Ser. No. 11/786,682 filed Apr. 11, 2007.

BACKGROUND OF THE INVENTION

1. Field of the Invention

The present invention is generally in the field of electronic communications. More particularly, the present invention is in the field of wireless electronic communications.

2. Background

In wireless communications, such as Bluetooth wireless communications, one electronic device (a paging device) typically initiates communication by paging another electronic device (a paged device) to establish a connection between the two devices. For example, a paging device can begin by transmitting a modulated signal including an ID packet to a paged device. The paged device can detect the modulated signal and can transmit a response signal to the paging device on a new frequency associated with the frequency on which the modulated signal was transmitted. The paged device can then wait for the paging device to send a response, such as a frequency hop synchronization (FHS) packet. The paging device can then send the response, e.g., the FHS packet, and can then wait for another response from the paged device.

The paging device, however, might often unintentionally transmit false modulated signals on frequencies other than the frequency on which the intended modulated signal is transmitted. The false modulated signals, for example, are typically created in the transmitter of the paging device by spurious signals that might undesirably become modulated during the modulation of the desired signals. Such false modulated signals may be inadvertently detected by the paged device, causing substantial delays in the paging process. Moreover, under strong signal conditions (e.g., when the desired signal is very strong), the false modulated signal can be large enough for the receiver of the paged device to detect the false modulated signal.

For example, when a paged device detects a false modulated signal, the paged device demodulates the false modulated signal and transmits a response signal to the paging device on a new frequency associated with the frequency on which the false modulated signal was transmitted. However, since the paging device is configured to listen to a response signal from the paged device on a frequency associated with the intended modulated signal, the paging device will be unable to properly reply to the response signal sent by the paged device. Furthermore, while the paged device is engaged in attempting to "close the loop" initiated by a false page, the paged device might miss true pages intended for the paged device. As such, the detection of false modulated signals by a paged device can substantially delay the paging and communication processes and can ultimately cause the paging process to fail.

SUMMARY OF THE INVENTION

A method and system for avoiding detection of false modulated signals in wireless communications, substantially as shown in and/or described in connection with at least one of the figures, as set forth more completely in the claims.

DETAILED DESCRIPTION OF THE INVENTION

The present invention is directed to method and system for avoiding detection of false modulated signals in wireless communications. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
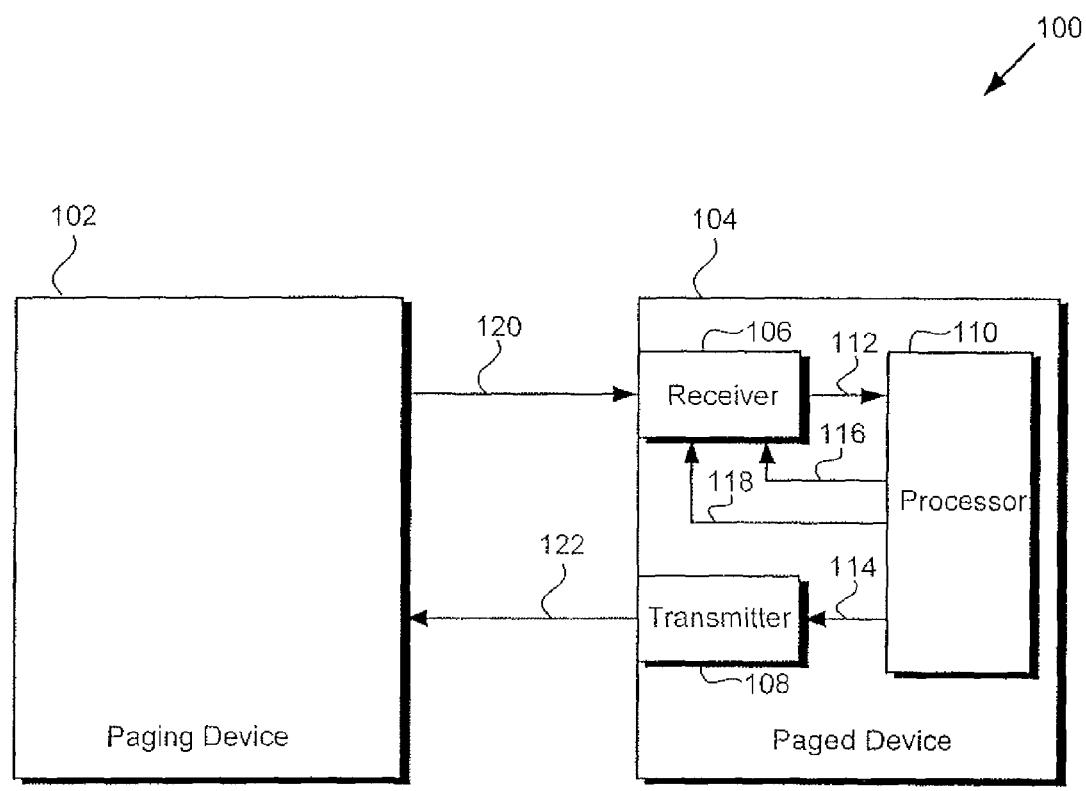
FIG. 1 shows a wireless communication system, including a paging device and a paged device, for implementing one embodiment of the invention.

FIG. 1 shows a wireless communication system, including a paging device and a paged device, for implementing one embodiment of the invention. System 100 includes paging device 102 and paged device 104, which can be, for example, Bluetooth enabled devices. As shown in FIG. 1, paged device 104 includes transmitter 108 and receiver 106, which are coupled to processor 110 via respective buses 114 and 112. As also shown in FIG. 1, paged device 104 can communicate with paging device 102 by transmitting and receiving wireless modulated signals, symbolically represented by lines 120 and 122 for simplicity and hereinafter referred to as modulated signals 120 and 122 to preserve brevity. Modulated signals 120 and 122 can be, for example, radio frequency (RF) signals typically used in wireless communication protocols, such as Bluetooth or Global System for Mobile Communication (GSM). As further shown in FIG. 1, processor 110 is configured to control receiver 106 via buses 116 and 118. As discussed below, paged device 104 can be configured to avoid the detection of false modulated signals transmitted from paging device 102.

Figure 2:
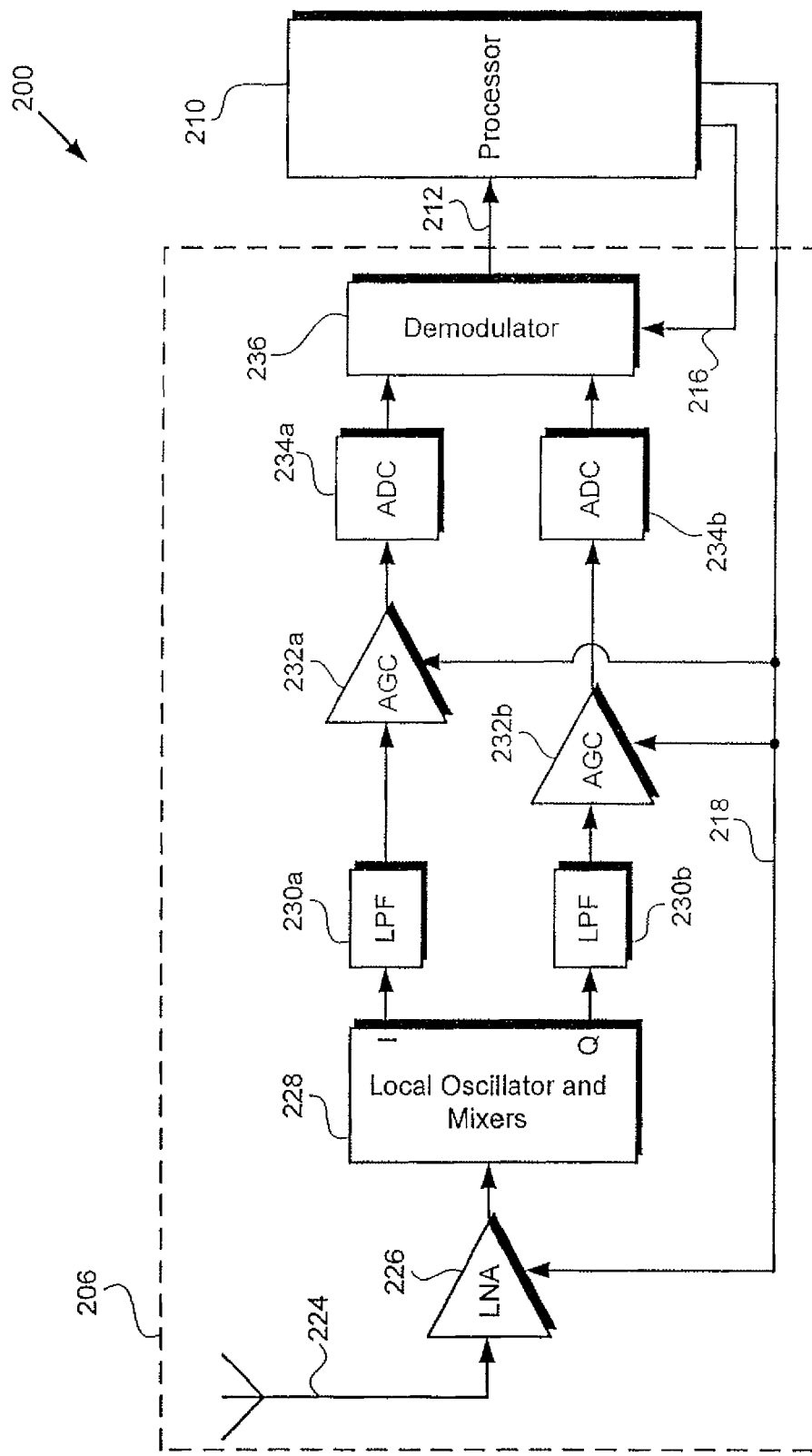
FIG. 2 shows a block diagram of portions of a paged device in a wireless communication system for implementing one embodiment of the invention.

FIG. 2 shows a block diagram of portions of a paged device in a wireless communication system for implementing one embodiment of the invention. Receiver 206 and processor 210 in FIG. 2 correspond to receiver 106 and processor 110 of paged device 104 in FIG. 1, respectively. As shown in FIG. 2, receiver 206 includes antenna 224, paged device amplifiers 226, 232a, and 232b, local oscillator and mixers 228, low pass filters (LPFs) 230a and 230b, analog to digital converters (ADCs) 234a and 234b, and demodulator 236.

A modulated signal transmitted from paging device 102 (shown in FIG. 1) can be received by antenna 224 and provided to the input of paged device amplifier 226. Paged device amplifier 226 can be, for example, a low noise amplifier (LNA). In other embodiments, paged device amplifier 226 can be a different type of amplifier, such as an automatic gain control (AGC) amplifier. Local oscillator and mixers 228 can be configured to receive a modulated signal from paged device amplifier 226. Local oscillator and mixers 228 comprise, for example, a local oscillator (not shown) configured to generate In-phase and Quadrature phase ("I-Q") output signals. The I and Q components of the local oscillation, i.e. the I and Q outputs of the local oscillator, are provided to respective mixers (not shown) for combining with the output of low noise amplifier 226. Thus, as shown in FIG. 2, the I and Q signals generated by local oscillator and mixers 228 can be provided to low pass filters 230a and 230b, respectively. The I and Q signals at frequencies low enough to pass through low pass filters 230a and 230b can then be provided to respective paged device amplifiers 232a and 232b, which can be, for example, AGC amplifiers. In another embodiment, low pass filters 230a and 230b can be respectively coupled to the outputs of paged device amplifiers 232a and 232b. The I and Q components of the amplified signals can then be provided to analog to digital converters 234a and 234b, respectively.

As shown in FIG. 2, demodulator 236 can be configured to receive the digitized I and Q signals from the outputs of analog to digital converters 234a and 234b. Demodulator 236 can be implemented, for example, in a digital signal processor (DSP) or by other dedicated hardware and/or a combination of hardware and software. Demodulator 236 can be configured to extract the data in the modulated signal received by paged device 104 by demodulating the I and Q signals using various demodulation techniques known in the art, such as those based on Gaussian Frequency Shift Keying (GFSK), Gaussian Minimum Shift Keying (GMSDK), or a variety of Phase Shift Keying (PSK). Demodulator 236 can then provide the extracted data to processor 210 via bus 212, which corresponds to bus 112 shown in FIG. 1. Processor 210 can be, for example, a microprocessor, a microcontroller, a digital signal processor, or other processing module. As shown in FIG. 2, processor 210 can control paged device amplifiers 226, 232a, and 232b via bus 218, and demodulator 236 via bus 216.

Figure 3:
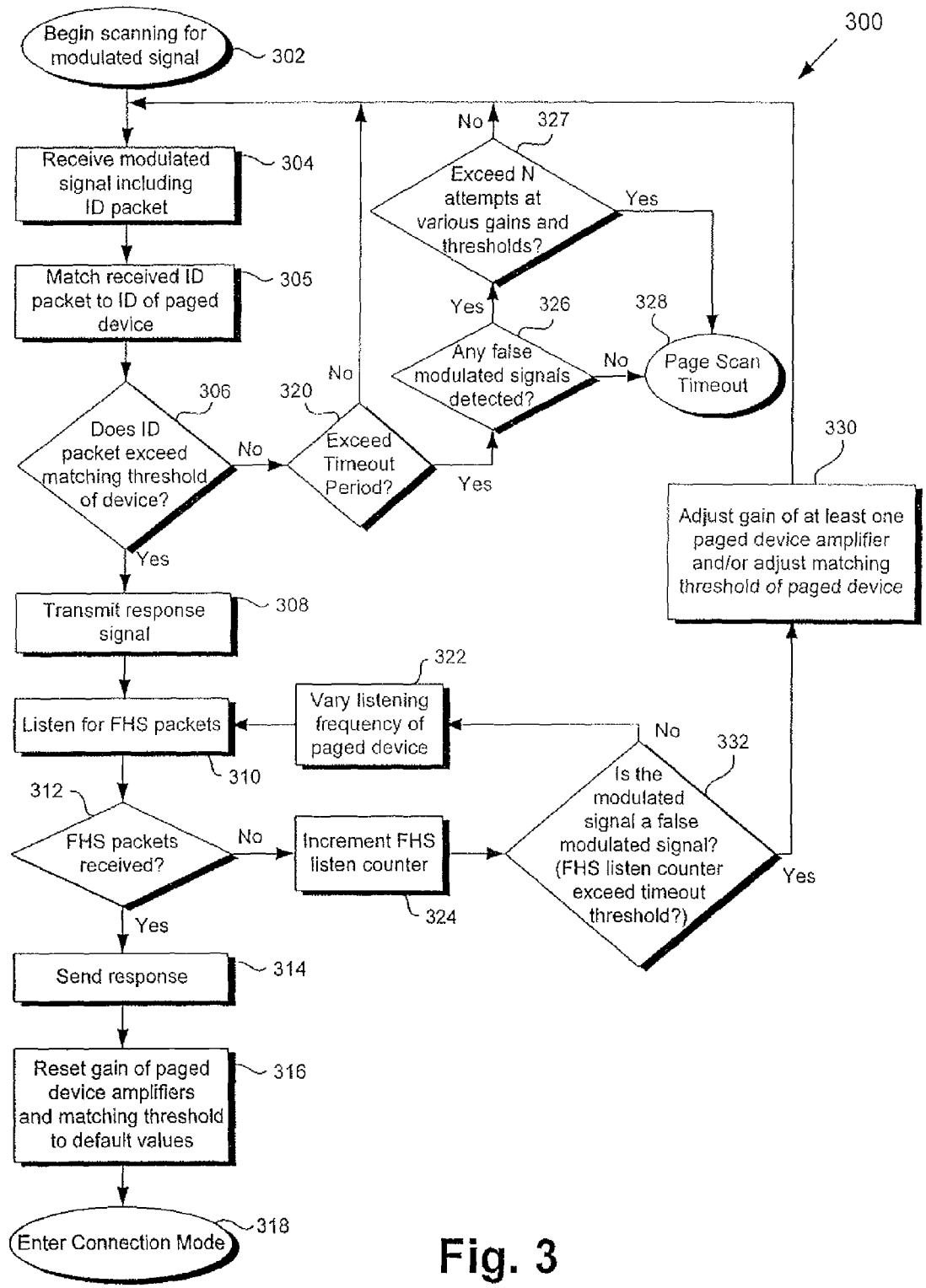
FIG. 3 shows a flowchart of an embodiment of the invention's method for implementation in a wireless communication system.

FIG. 3 shows a flowchart of an embodiment of the invention's method for implementation in a wireless communication system. More specifically, flowchart 300 shows one embodiment of the invention's method that can be implemented to avoid detection of false modulated signals in a paged device in a wireless communication system. As shown in FIG. 3 and with reference to FIGS. 1 and 2, at step 302 of flowchart 300, paged device 104 begins to scan for a modulated signal. The modulated signal can be, for example, a page signal typically transmitted by a paging device in a Bluetooth protocol for establishing a connection between the paging device and the paged device. At step 304, a modulated signal transmitted by paging device 102, and which includes an identification (ID) packet, is received by paged device 104. To acquire the ID packet, the modulated signal is amplified by paged device amplifier, e.g. LNA 226, and converted by local oscillator and mixers 228 into I and Q signals in a manner discussed above. Thereafter, the I and Q signals are filtered through respective low pass filters 230a and 230b and amplified by respective paged device amplifiers, e.g. AGCs 232a and 232b. The I and Q signals are then provided to the inputs of respective analog to digital converters 234a and 234b. The digitized I and Q signals from the outputs of analog to digital converters 234a and 234b are then provided to demodulator 236, which can demodulate the digitized I and Q signals to acquire the ID packet.

At step 305, the ID packet is analyzed by paged device 104 to determine a degree of matching between the received ID packet and the ID of paged device 104. For example, the degree of matching between the ID packet and the ID of paged device 104 can be determined by processor 210. The ID of paged device 104 can be, for example, a 68-bit device access code (DAC) or inquiry access code (IAC) typically used in a Bluetooth communication protocol. For example, if only 51 of the bits in the ID packet correctly match the 68-bit ID of paged device 104, then processor 210 can determine the degree of matching to be 75.0%. At step 306, it is determined whether the degree of matching exceeds the matching threshold of paged device 104. For example, processor 210 can be configured to store a matching threshold of paged device 104 and to determine whether the degree of matching exceeds the matching threshold. Therefore, if the matching threshold stored in processor 210 is 70.0%, then processor 210 may determine the ID packet with a degree of matching of 75.0% to exceed the matching threshold. If the ID packet does not exceed the matching threshold at step 306, then at step 320, it is determined whether the timeout period has been exceeded. The condition where the timeout period has been exceeded can also be referred to as a "page scan failure." If the timeout period has not been exceeded, i.e., if a page scan failure has not occurred, then steps 304 through 306 are repeated. Otherwise, at step 326, it is determined whether any false modulated signals have been detected. If no false modulated signals have been detected, then a page scan timeout is declared at step 328 and the process is stopped. If false modulated signals have been detected, then at step 327, steps 304 through 306 are repeated an "N" number of times at various gain settings of at least one paged device amplifier and/or at various matching thresholds of the paged device. In one embodiment, "N" can be a user-specified integer. Thus, once "N" has been exceeded, a page scan timeout is declared at step 328 and the process is stopped.

If the ID packet does exceed the matching threshold at step 306, then at step 308, a response signal is transmitted by paged device 104 to paging device 102. The response signal can be transmitted to paging device 102 using a frequency associated with the frequency on which the modulated signal was received. At step 310, paged device 104 listens for a frequency hop synchronization (FHS) packet transmitted from paging device 102 in response to the response signal transmitted at step 308. For example, paged device 104 can listen for a period of 625.0 microseconds. At step 312, it is determined whether any FHS packets were received by paged device 104. If no FHS packets were received, then at step 324, an FHS listen counter is incremented. For example, the FHS listen counter can be an up-counter implemented in hardware or software. Then at step 332, it is determined whether the modulated signal received at step 304 is in fact a false modulated signal by determining whether the FHS listen counter has exceeded a timeout threshold. The condition where the FHS listen counter has exceeded the timeout threshold can also be referred to as a "page scan response failure." If the FHS listen counter has not exceeded the timeout threshold, then at step 322, the listening frequency of paged device 104 is varied to allow paged device 104 to listen for FHS packets on another frequency and thereafter, step 310 is repeated.

If at step 332 it is determined that the FHS listen counter has exceeded the timeout threshold, then the modulated signal received at step 304 is identified as a false modulated signal (also referred to as a "preliminary false modulated signal" in the present application). Then, at step 330, the gain of at least one paged device amplifier and/or the matching threshold of the paged device is adjusted by paged device 104. For example, processor 210 can be configured to reduce the gain of paged device amplifier 226 (LNA 226) and/or reduce the gains of page device amplifiers 232a and 232b (AGCs 232a and 232b) via bus 218. Alternatively, the matching threshold of paged device 104 can be increased. For example, processor 210 can increase the matching threshold from 70.0%, as in the example provided above, to 80.0%. In one embodiment, both the gain and the matching threshold are adjusted by paged device 104. Thereafter, step 302 is repeated. However, if at step 312 it is determined that paged device 104 received an FHS packet, then at step 314, paged device 104 sends a response to paging device 102. Thereafter, at step 316, the gains of the paged device amplifiers and the matching threshold are reset to their default values. Then, at step 318, paged device 104 enters a connection mode with paging device 102.

Thus, by adjusting the gain of at least one paged device amplifier and/or the matching threshold of paged device 104 after identifying a preliminary false modulated signal, the present invention allows paged device 104 to avoid detection of a future false modulated signal. In other words, once a preliminary false modulated signal is detected by paged device 104, the sensitivity of paged device 104 is reduced, e.g., by appropriately reducing the gain of at least one paged device amplifier and/or increasing the matching threshold of paged device 104, to avoid detection of a future false modulated signal.

For example, by reducing the gain of paged device amplifier 226 (LNA 226) shown in FIG. 2, the noise floor of receiver 206 can be increased to effectively drown out as noise a future false modulated signal received by paged device 104. Furthermore, since the preliminary and future false modulated signals transmitted by a paging device are typically much lower in amplitude than the intended modulated signals, the reduction in gain allows the intended modulated signals to be properly received and detected by paged device 104. As such, the invention advantageously allows a paged device to avoid detection of a future false modulated signal, without preventing the detection of intended modulated signals.

As another example, the present invention results in avoiding detection of a future false modulated signal by increasing the matching threshold of paged device 104. More specifically, since the accuracy of an ID packet included in a false modulated signal is lower than the accuracy of an ID packet included in an intended modulated signal, the matching threshold can be increased upon detection of a preliminary false modulated signal to prevent a future false modulated signal from exceeding the matching threshold of paged device 104. As such, paged device 104 can avoid detection of a future false modulated signal while still being able to detect an intended modulated signal.

Thus, the present invention provides several significant advantages. For example, by enabling a paged device to avoid detection of a future false modulated signal, the paged device can avoid responding to such a future false modulated signal during a paging process. As such, the period of time to complete the paging process between a paging device and a paged device can be substantially reduced, thereby improving the performance of the paged device. Furthermore, by reducing the period of time required to complete a paging process, the present invention can also provide considerable power savings. Moreover, the present invention allows for more robust communication between a paging device and a paged device since, in the absence of the present invention, responses transmitted by the paged device in response to a false modulated signal may result in the paged device failing to detect an intended modulated signal completely. As such, the present invention improves a paged device's ability to detect an intended modulated signal.

Although the present invention has been described with reference to a paging process between a paging device and a paged device, it is noted that the present invention can also be applied to avoid detection of false modulated signals transmitted from a device during other wireless communication processes, e.g., during an inquiry process typically used in a Bluetooth communication protocol. Thus, in one embodiment, the modulated signal received by device 104 can be an inquiry signal.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method and system for avoiding detection of false modulated signals in wireless communications have been described.

The invention claimed is:

1. A system for wireless communication, said system comprising:
   a receiver configured to receive a modulated signal;
   a processor coupled to said receiver, said processor being configured to identify said modulated signal as a preliminary false modulated signal and to reduce a gain of at least one amplifier in said receiver.

2. The system of claim 1, wherein said wireless communication comprises a Bluetooth wireless communication, and wherein said system comprises a Bluetooth enabled device.

3. The system of claim 1, wherein said modulated signal is an inquiry signal.

4. The system of claim 1, wherein said modulated signal is a page signal.

5. The system of claim 1, wherein said at least one amplifier is a low noise amplifier (LNA).

6. A method for use in a wireless communication device, said method comprising:
   receiving a modulated signal;
   identifying a preliminary false modulated signal;
   reducing a gain of at least one amplifier in said wireless communications device to avoid detection of false modulated signals.

7. The method of claim 6, wherein said wireless communications device comprises a Bluetooth enabled device.

8. The method of claim 6, wherein said identifying said preliminary false modulated signal further comprises:
   transmitting a response signal by said wireless communications device in response to said preliminary false modulated signal;
   failing to receive in said wireless communications device a frequency hop synchronization (FHS) packet in reply to said response signal.

9. The method of claim 6, wherein said modulated signal is an inquiry signal.

10. The method of claim 6, wherein said modulated signal is a page signal.

11. The method of claim 6, wherein said at least one amplifier is a low noise amplifier (LNA).

12. The method of claim 6, further comprising resetting said gain of said at least one amplifier after said wireless communications device receives a frequency hop synchronization (FHS) packet.

* * * * *